June 30, 1964 C. C. PHILLIPS 3,139,560

CIRCUIT BOARD ASSEMBLY

Filed Jan. 29, 1960 2 Sheets-Sheet 1

INVENTOR
CASWELL C. PHILLIPS

BY [signature]

ATTORNEY

United States Patent Office 3,139,560
Patented June 30, 1964

3,139,560
CIRCUIT BOARD ASSEMBLY

Caswell C. Phillips, Sepulveda, Calif., assignor to General Precision, Inc., a corporation of Delaware
Filed Jan. 29, 1960, Ser. No. 5,451
3 Claims. (Cl. 317—101)

The present invention relates to circuit board assemblies for packaging and supporting a plurality of electrical components, and for supporting suitable circuitry for interconnecting the electrical components. The assembly of the present invention is particularly suited for use in the module construction of present-day complex electronic apparatus.

With the advent of electronic apparatus and systems of increasing complexity, it is most desirable to provide appropriate mountings for the electrical components and circuitry incorporated in such apparatus and systems. It is also most essential that such mountings support the components and circuitry of the electronic apparatus in a manner such that the space requirements of the apparatus are reduced to a minimum. It is also desirable that the mountings be removable as units for repair or replacement purposes.

In accordance with the concepts outlined in the preceding paragraph, the more complex types of present-day electronic apparatus are usually made up of a plurality of removable modules or units. Each of these modules is a separate entity in itself, and each may be plugged into the electronic apparatus with which it is associated. Then, in the case of a malfunctioning of any particular component in the electronic apparatus, the entire unit may be removed and replaced by the new one. This facilitates the maintenance and servicing of the more complex types of electronic equipment.

For the purposes outlined above, circuit boards have been devised which have electric circuitry formed on one or both surfaces, and these boards are constructed to physically support electrical components in electrical contact with the circuitry, the circuitry providing desired connections between the components. It is usual practice, for example, to mount the different logic control circuits of present-day electronic digital computers, and the like, on a multiplicity of "logic cards." These logic cards may take the form of the circuit boards described above, and they support and provide electrical connections to the different electrical components required by the computer. The logic cards are usually plugged into appropriate receptacles to facilitate replacements. The improved circuit board assemblies of the present invention are ideally suited for use as the logic cards in digital computers, and the like.

The general object of the present invention, therefore, is to provide an improved circuit board assembly which is capable of supporting a plurality of electronic components, such as resistors, diodes, capacitors, and the like, in a firm and rigid manner; and of supporting such components in a protected position so that they do not protrude from the assembly and, therefore, are not susceptible of being damaged or accidentally broken from the supporting board members.

In accordance with the concepts of the present invention, the electrical components are supported in the assembly in a sandwiched relationship between a pair of supporting board members. This construction provides a unitary, rugged and rigid unit. Moreover, in accordance with the present invention, the supporting board members are provided with access holes. The provision of supporting board members equipped with such access holes, as will be described in detail, provides an improved construction, whereby the different electrical components may be readily and conveniently inserted into position between the supporting board members or removed for repair or replacement purposes.

In the embodiment of the invention to be described, the circuit board assembly of that embodiment includes a pair of insulating boards or panels, which are rigidly held in spaced parallel relationship by appropriate bracket and spacer elements. Interconnecting circuitry is formed on one or both surfaces of each of the boards, and terminal apertures are formed in the boards for receiving the connecting leads of the electrical components to be supported and mounted in the assembly, these leads may, for example, be the usual pigtail connectors which extend from the ends of electrical components, such as resistors, capacitors, diodes, etc., which are to be mounted in the units. These components are supported between the parallel circuit boards of the individual units by their connectors, with the connectors being in electrical contact with the circuitry on the boards by soldering, or the like.

The assembly of the present invention provides, therefore, an improved circuit board assembly in which electrical components are supported in a protected position between a pair of parallel boards. The electrical components may be inserted into such a protected position in the improved assembly of the invention through access holes which are provided in at least one of the boards. The provision of these access holes enables the electrical components to be conveniently inserted at desired positions between the boards to be supported in the assembly and to be electrically connected to the electric circuitry on the boards of the assembly.

The resulting structure forms a unitary assembly which is rigid in its construction. Moreover, the structure does not include any protruding or projecting elements. The structure may be equipped with suitable terminal plugs so that it may be connected into a corresponding receptacle in the electronic apparatus with which it is to be used. The structure is most appropriate, therefore, for use with a multiplicity of similar structures in the more complex electronic systems and equipment.

In accordance with a particular aspect of the invention, the improved circuit board assembly may be used to support heat-producing electrical components, such as power transistors. These latter components also are supported on the insulating boards of the individual units. The spacers between the insulating boards may be formed of heat conducting material. The power transistors, or other heat producing components, may be mounted in contact with the heat conducting spacers, so that the spacers may additionally serve as heat sinks for those components.

Figure 1:
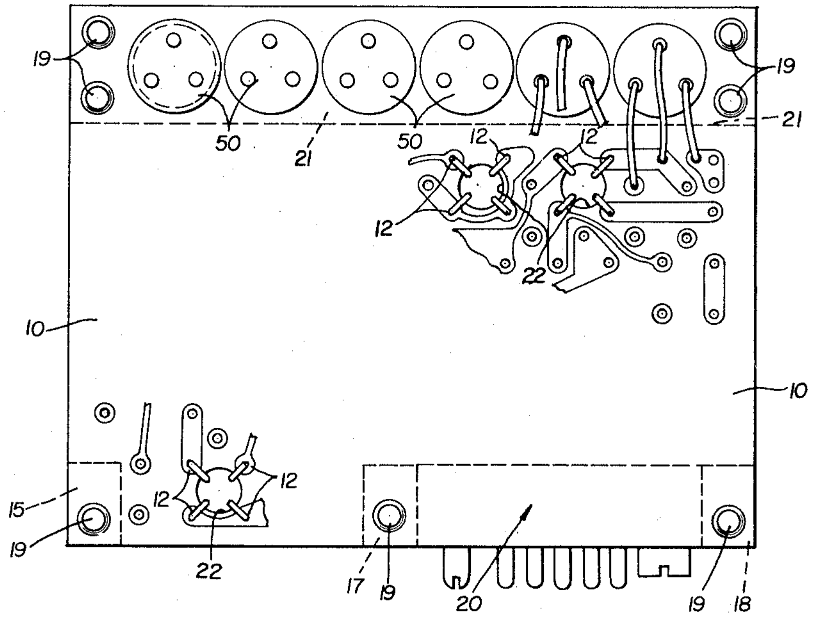
FIGURE 1 is a top plan view of a circuit board assembly which is constructed in accordance with the concepts of the present invention to have an apertured configuration, so that access openings may be provided for the reasons described above and to be described in detail in the following specification.
Figure 3:
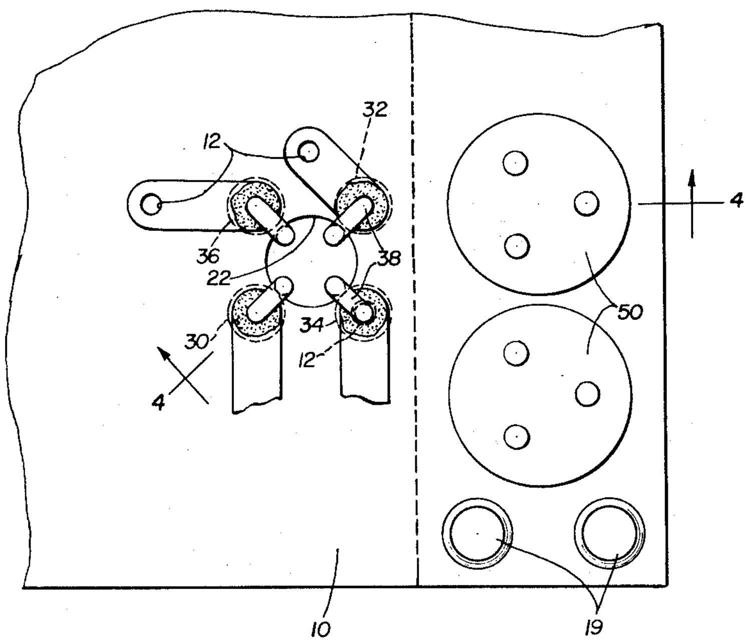
Figure 4:
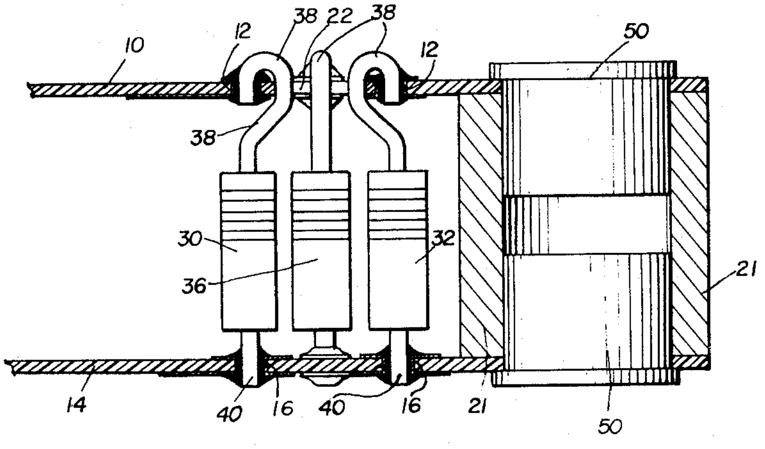

FIGURE 3 is an enlarged fragmentary view of the circuit board of FIGURE 1, this latter view showing particularly the manner in which an access opening is formed in the board and the manner in which electric components may be grouped around the opening and supported in the assembly; and FIGURE 4 is a sectional view, substantially on the lines 4—4 of FIGURE 3, this latter view showing the manner in which certain electrical components may be supported in the assembly between the two circuit boards.

The assembly illustrated in the accompanying drawings includes a first top circuit board 10 having electrical circuitry formed, for example, on its upper surface. This circuitry may be formed by any of the many presently known techniques for providing circuit conductors on an insulating panel. The circuit board 10 also includes a plurality of terminal apertures 12 which extend through it. These apertures are metallized with a conductive material, and the circuitry on the boards extends into electrical connection with different ones of the metallized terminal apertures.

Figure 2:
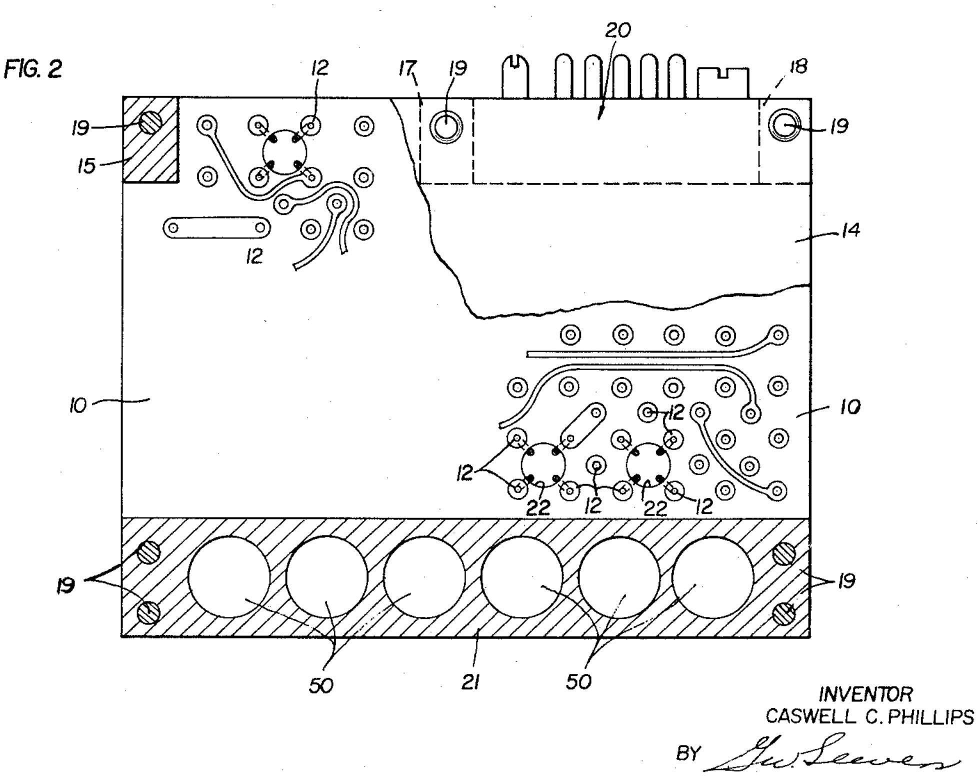
FIGURE 2 is a bottom view of the circuit board assembly of FIGURE 1, with the major portion of the lower board removed to reveal the underside of the upper board.

The assembly also includes a second bottom circuit board 14 which is shown, for example, in FIGURE 2. The bottom circuit board 14 also includes appropriate circuitry which is formed on its lower surface, and the circuit board 14 also includes a plurality of terminal apertures 16. These latter terminal apertures are also metallized and connected to the circuitry on the board 14, and they are arranged to be in axial alignment with corresponding ones of the metallized terminal apertures 12 in the top board 10. As noted above, the apertures 16 are also metallized, and they are connected into the circuitry on the board 14.

A first group of spacer members 15, 17 and 18 are affixed to the top circuit board 10 and to the bottom circuit board 14. These spacer members are affixed to the circuit boards by any appropriate means, such as by a plurality of rivets 19. The spacer members 18 may be positioned along one side of the assembly, as shown in FIGURES 1 and 2, and they serve to support the circuit boards 10 and 12 in spaced and parallel relationship. A suitable terminal block 20 is mounted between the spacers 17 and 18, as shown.

A further spacer member 21 is positioned between the circuit boards 10 and 16, and this latter spacer takes the form of an apertured block extending along a side of the assembly, as illustrated, opposite to the side referred to above. The spacer member 21 is also fastened to the top and bottom circuit board by suitable fastening means, such as rivets 19.

The resulting unit is rigid and compact, and is ideally suited for use in the module type of electronic apparatus. The terminals on the terminal block 20 are connected to the electrical circuitry on the boards 10 and 16, and these terminals may be plugged into receptacles in the apparatus.

The circuit board 10 is provided with a plurality of access openings 22, so that it has an apertured configuration. These access holes, or openings in the circuit board 10 are surrounded by groups of the terminal apertures 12; and corresponding groups of the apertures 16 in the bottom board 14 are aligned with the groups in the upper board so that a corresponding number of electrical components may be supported between the circuit boards with their connectors extending into the respective metallized terminal apertures. For example, as shown in FIGURES 3 and 4, a group of four circuit components designated 30, 32, 34 and 36 are supported between the circuit boards 10 and 14 around one of the access holes 22. These components may, as indicated above, take the form of capacitors, resistors, diodes, or the like. Each of the components has a pair of pigtail wire connectors 38 and 40 extending from its respective ends. Each of the lower connectors 40 is straight, but each of the upper connectors 38 is formed into a loop, as best shown in FIGURE 4.

The components 30, 32, 34 and 36 are each mounted in the assembly by individually inserting them through the access hole 22, and by threading their lower connectors 40 into corresponding terminal apertures 16 in the lower board 14. The looped upper connectors 38 are then each hooked around the rim of the access hole 22 and inserted down into the corresponding terminal apertures 12, as best shown in FIGURE 3. The connectors 38 and 40 of the components may then be soldered in place in the metallized apertures 12 and 16.

It will be appreciated, that the access hole 22 of FIGURE 3 permits a cluster of electrical components to be inserted and mounted between the circuit boards 10 and 14 in electrical connection with the circuitry on the boards. The similar access holes 22 disposed at different positions in the circuit board 10 in FIGURE 1, permits similar clusters of components to be mounted in the assembly around the other access holes.

The assembly may also support heat producing electrical components, such as a plurality of power transistors 50. These transistors are supported in apertures in the circuit boards 10 and 14, and the leads from the transistors are connected to the terminal apertures 12 and 16 in the same manner as the connectors from the other components, and as shown, for example, in FIGURE 1.

It is usual practice for the housing of a power transistor to form the heat-producing collector electrode. In the assembly of FIGURES 3 and 4, the housings of the power transistors 50 are inserted in the apertures of the apertured block 21. In this manner the housings of the transistors 50 are positioned in an engaged relationship with the spacer member 21. The spacer member 21 may be composed of a block of heat conducting material; so that this member 21 not only serves as a mounting means for the transistors and as a spacing means for the circuit boards 10 and 14, but so that it also serves as a heat sink for the power transistor.

The invention provides, therefore, an improved modular assembly for supporting and interconnecting electrical components. The assembly of the invention includes a pair of circuit boards which are supported in spaced relationship, and the electrical components are mounted in a protected position between the boards. At least one of the circuit boards has an apertured configuration to provide access holes for the components. This enables the different electrical components to be assembled into the unit easily and conveniently in the manner described above. This also facilitates the replacement of defective components and greatly simplifies maintenance of the assembly. The assembly is also advantageous in that the components may be supported between the boards in a resilient manner by their pigtail connectors, and this resists damage due to vibration as would be more likely to occur if the components were rigidly attached to the circuit boards. In addition to the advantages enumerated above, a spacer for the assembly may additionally serve as a heat sink for certain heat-producing components (such as power transistors) supported in the assembly, as described above.

What is claimed is:

1. An assembly for supporting at least one elongated electrical component, said electrical component having a pair of pigtail electrical connectors extending from the respective ends thereof with one of said connectors having a hooked end and the other having a straight end, said assembly including: a first planar printed circuit mounting board having at least one access opening therein through which the electrical component may be inserted and having at least one metallized terminal aperture therein adjacent said access opening for receiving the hooked end of said one of said electrical connectors of the electrical component; a second planar printed circuit mounting board having at least one metallized terminal aperture therein aligned with the terminal aperture in said first board for receiving said straight end of the other of said electrical connectors of the electrical component; spacing members affixed to said first planar mounting board and to said second planar mounting board supporting said mounting boards in a unitary assembled condition with respect to one another and in mutually spaced parallel relationship, with the electrical component being supported by the mounting boards and extending therebetween and with the hooked end of said one of said electrical connectors thereof extending through the access opening and down into said adjacent terminal aperture in said first planar mounting board, and with the straight end of said other one of said electrical connectors thereof extending into said terminal aperture in said second planar mounting board; and solder means in said terminal apertures for maintaining the component in place and for establishing electrical connections between said electrical component and the printed circuits on said first and second mounting boards.

2. The assembly defined in claim 1 and in which at least one of said spacing members is formed of heat conducting material, and which includes means for supporting a heat producing electrical component in engagement with said one of said spacing members so that said heat conducting spacing member may serve to conduct heat away from the heat producing component.

3. The assembly defined in claim 1 and which includes a spacing member between said first and second planar mounting boards in the form of an apertured block of heat conducting material extending along one side of the assembly, and at least one heat producing electrical component supported in the aperture in said block and in contact therewith so that said block may serve as a heat sink to conduct heat away from the heat producing component.

References Cited in the file of this patent

UNITED STATES PATENTS

| | | |
|---|---|---|
| 2,245,379 | Barton | June 10, 1941 |
| 2,881,364 | Demer | Apr. 7, 1959 |
| 2,892,129 | Henry | June 23, 1959 |
| 2,911,572 | Francis | Nov. 3, 1959 |
| 2,929,964 | Rhys-Jones | Mar. 22, 1960 |
| 2,934,814 | Williams | May 3, 1960 |
| 2,960,633 | Hall | Nov. 15, 1960 |

FOREIGN PATENTS

| | | |
|---|---|---|
| 791,440 | Great Britain | Mar. 5, 1958 |

OTHER REFERENCES

Electronics, December 1955, page 230.